(12) United States Patent
Kim

(10) Patent No.: US 9,001,092 B2
(45) Date of Patent: Apr. 7, 2015

(54) VOLTAGE SUMMING BUFFER, DIGITAL-TO-ANALOG CONVERTER AND SOURCE DRIVER OF DISPLAY DEVICE INCLUDING THE SAME

(75) Inventor: Ki-Duk Kim, Ulsan-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 325 days.

(21) Appl. No.: 13/602,845

(22) Filed: Sep. 4, 2012

(65) Prior Publication Data

US 2013/0141474 A1   Jun. 6, 2013

(30) Foreign Application Priority Data

Dec. 1, 2011   (KR) ........................ 10-2011-0127724

(51) Int. Cl.
| | |
|---|---|
| *G09G 5/00* | (2006.01) |
| *G09G 3/20* | (2006.01) |
| *G09G 3/32* | (2006.01) |
| *G09G 3/36* | (2006.01) |
| *H03F 3/21* | (2006.01) |
| *H03F 3/45* | (2006.01) |
| *H03F 3/72* | (2006.01) |
| *H03M 1/68* | (2006.01) |
| *H03M 1/76* | (2006.01) |

(52) U.S. Cl.
CPC ................ *G09G 3/20* (2013.01); *G09G 3/2037* (2013.01); *G09G 3/3266* (2013.01); *G09G 3/3275* (2013.01); *G09G 3/3674* (2013.01); *G09G 3/3685* (2013.01); *G09G 3/3696* (2013.01); *G09G 2300/0426* (2013.01); *G09G 2310/0267* (2013.01); *G09G 2310/027* (2013.01); *G09G 2310/0291* (2013.01); *G09G 2320/0673* (2013.01); *G09G 2330/028* (2013.01); *H03F 3/211* (2013.01); *H03F 3/45085* (2013.01); *H03F 3/45282* (2013.01); *H03F 3/72* (2013.01); *H03F 2203/21127* (2013.01); *H03F 2203/21191* (2013.01); *H03F 2203/45506* (2013.01); *H03F 2203/45646* (2013.01); *H03F 2203/7227* (2013.01); *H03F 2203/7236* (2013.01); *H03M 1/682* (2013.01); *H03M 1/765* (2013.01)

(58) Field of Classification Search
USPC .............. 345/55, 77, 204, 211, 690; 341/144, 341/145; 348/254, 674
See application file for complete search history.

(56) References Cited

U.S. PATENT DOCUMENTS 5,585,795 A * 12/1996 Yuasa et al. ................... 341/118
5,933,199 A    8/1999 Yoon
(Continued)

FOREIGN PATENT DOCUMENTS

KR   10-2001-0045935 A   6/2001
KR   10-2003-0012301 A   2/2003
(Continued)

*Primary Examiner* — Joe H Cheng
(74) *Attorney, Agent, or Firm* — Lee & Morse, P.C.

(57) ABSTRACT

A digital-to-analog converter includes a first decoder, a second decoder and a voltage summing buffer. The first decoder receives upper bits of a digital signal and upper reference voltages to output an upper voltage corresponding to the upper bits. The second decoder configured to receive lower bits of the digital signal and lower reference voltages to output a lower differential voltage corresponding to the lower bits. The voltage summing buffer generates an output voltage based on the upper voltage and the lower differential voltage, such that the output voltage corresponds to the digital signal including the upper bits and the lower bits.

20 Claims, 14 Drawing Sheets

(56) References Cited

U.S. PATENT DOCUMENTS

| | | |
|---|---|---|
| 7,339,511 B2 | 3/2008 | Son et al. |
| 7,633,479 B2 | 12/2009 | Kobayashi et al. |
| 8,581,824 B2 * | 11/2013 | Baek et al. .................. 345/100 |
| 2002/0008650 A1 | 1/2002 | Yoon |
| 2006/0007028 A1 | 1/2006 | Lan et al. |
| 2006/0055640 A1 | 3/2006 | Ota |
| 2008/0238748 A1 | 10/2008 | Wu et al. |
| 2010/0141493 A1 | 6/2010 | Cho et al. |
| 2012/0133800 A1 * | 5/2012 | Jung et al. .................. 348/241 |

FOREIGN PATENT DOCUMENTS

| | | |
|---|---|---|
| KR | 10-2004-0062052 A | 7/2004 |
| KR | 10-2006-0004600 A | 1/2006 |
| KR | 10-2009-0088028 A | 8/2009 |

* cited by examiner

FIG. 4

| D3 | D2 | D1 | D0 | VL(=Vp-Vn) |
|---|---|---|---|---|
| 0 | 0 | 0 | 0 | $-8Vgl$ |
| | 0 | 0 | 1 | $-7Vgl$ |
| | 0 | 1 | 0 | $-6Vgl$ |
| | 0 | 1 | 1 | $-5Vgl$ |
| | 1 | 0 | 0 | $-4Vgl$ |
| | 1 | 0 | 1 | $-3Vgl$ |
| | 1 | 1 | 0 | $-2Vgl$ |
| | 1 | 1 | 1 | $-Vgl$ |
| 1 | 0 | 0 | 0 | 0 |
| | 0 | 0 | 1 | $Vgl$ |
| | 0 | 1 | 0 | $2Vgl$ |
| | 0 | 1 | 1 | $3Vgl$ |
| | 1 | 0 | 0 | $4Vgl$ |
| | 1 | 0 | 1 | $5Vgl$ |
| | 1 | 1 | 0 | $6Vgl$ |
| | 1 | 1 | 1 | $7Vgl$ |

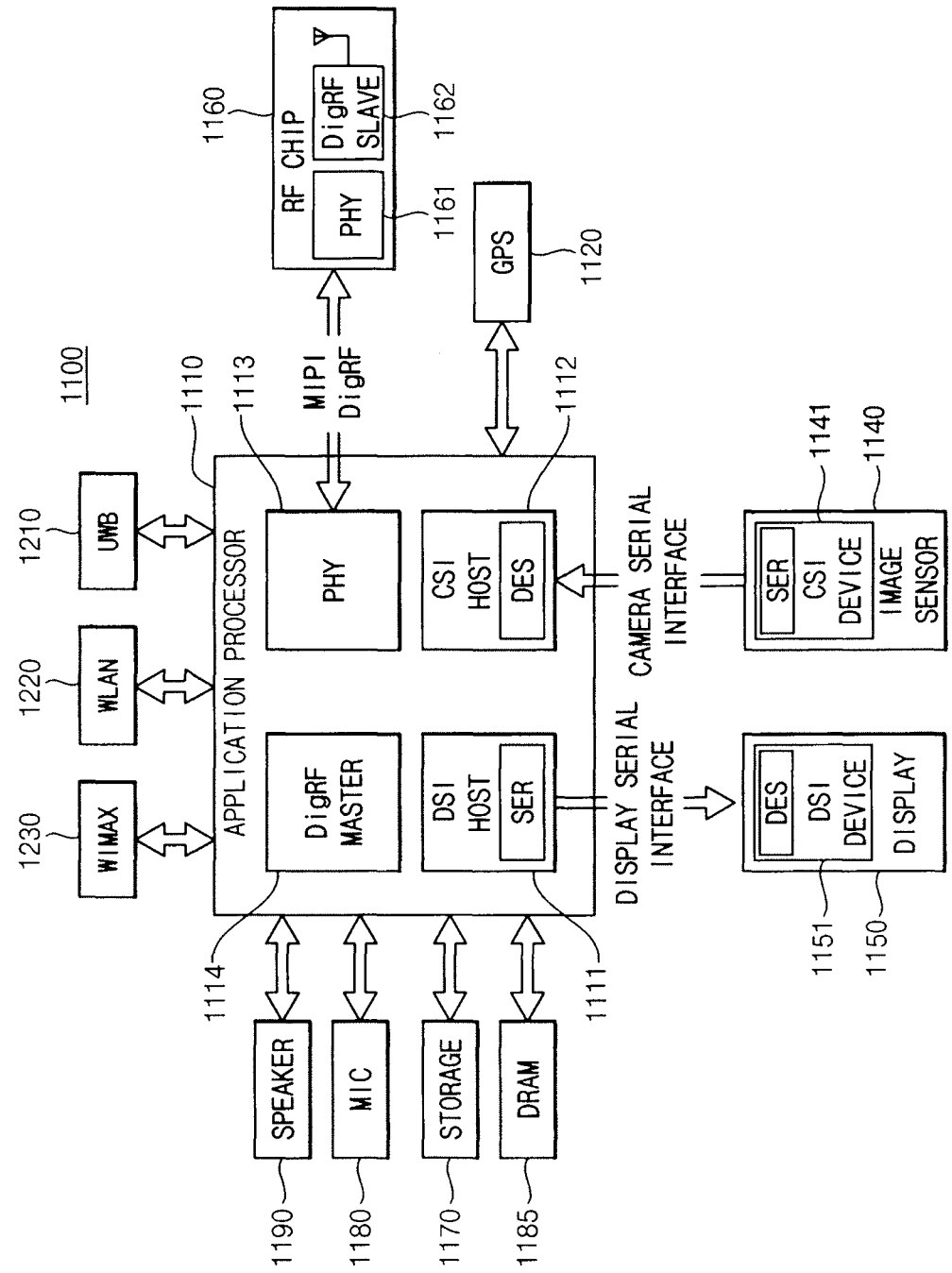

VOLTAGE SUMMING BUFFER, DIGITAL-TO-ANALOG CONVERTER AND SOURCE DRIVER OF DISPLAY DEVICE INCLUDING THE SAME

CROSS-REFERENCE TO RELATED APPLICATION

This application claims priority under 35 U.S.C. §119 to Korean Patent Application No. 10-2011-0127724, filed on Dec. 1, 2011, in the Korean Intellectual Property Office (KIPO), and entitled, "Voltage Summing Buffer, Digital-to-Analog Converter and Source Driver of Display Device including the Same," the contents of which are herein incorporated by reference in their entirety for all purposes.

BACKGROUND

1. Field

Example embodiments relate generally to semiconductor devices, and more particularly to a voltage summing buffer, a digital-to-analog converter including the voltage summing buffer and a source driver of a display device including the digital-to-analog converter.

2. Description of the Related Art

A digital-to-analog converter may be used in various devices and systems to convert digital signals to analog signals. For example, a driver integration circuit of driving a display device may use a relatively large number of digital-to-analog converters corresponding to the number of source lines, that is, data lines or column lines, of a display panel. As resolution of the display device is increased, the number of voltage lines may be increased to provide reference voltages to the digital-to-analog converters. In addition, as a bit number of a digital signal is increased to enhance quality of image that is to be displayed by the display device, an area occupied by decoders or pass transfer logics in the digital-to-analog converter may increase exponentially.

SUMMARY

Embodiments are directed to a digital-to-analog converter, including a first decoder configured to receive upper bits of a digital signal and upper reference voltages to output an upper voltage corresponding to the upper bits, a second decoder configured to receive lower bits of the digital signal and lower reference voltages to output a lower differential voltage corresponding to the lower bits, and a voltage summing buffer configured to generate an output voltage based on the upper voltage and the lower differential voltage, the output voltage corresponding to the digital signal including the upper bits and the lower bits.

The first decoder may select one of the upper reference voltages in response to the upper bits to output the selected upper reference voltage as the upper voltage, and the second decoder may select a positive voltage and a negative voltage among the lower reference voltages in response to the lower bits to output the positive voltage and the negative voltage as the lower differential voltage.

The first decoder may select a lowest voltage from among the upper reference voltages when the upper bits are all zero, and the second decoder may select a maximum voltage from among the lower reference voltages when a most significant bit of the lower bits is zero.

The digital-to-analog converter may further include an upper reference voltage generator configured to generate $2^n$ upper reference voltages with respect to n upper bits, n being a positive integer, the $2^n$ upper reference voltages being uniformly spaced by a first voltage amount, and a lower reference voltage generator configured to generate $2^{n-1}+1$ lower reference voltages with respect to m lower bits, m being a positive integer, the $2^{n-1}+1$ lower reference voltages being uniformly spaced by a second voltage amount smaller than the first voltage amount.

The lower differential voltage may be sequentially increased by Vg1 from -Vgm/2 to Vgm/2 as a value of the lower bits is increased by one, Vgm being the first voltage amount and Vg1 being the second voltage amount.

The second decoder may include a multiplexer configured to select a maximum voltage or a minimum voltage among the lower reference voltages in response to a most significant bit of the lower bits to output the selected voltage as the negative voltage of the lower differential voltage, and a pass transistor logic configured to select one of the lower reference voltages in response to remaining bits of the lower bits, the remaining bits being the lower bits except the most significant bit of the lower bits, to output the selected voltage as the positive voltage of the lower differential voltage.

The voltage summing buffer may include a first differential amplifier configured to receive the output voltage as feedback and receive the upper voltage, the feedback output voltage and the upper voltage being received as a first differential input, to generate a first differential current to a summing node pair, a second differential amplifier configured to receive the positive voltage and the negative voltage of the lower differential voltage as a second differential input to generate a second differential current to the summing node pair, and an output buffer configured to generate the output voltage based on a voltage or a current of at least one node of the summing node pair.

A transconductance of the first differential amplifier may be substantially equal to a transconductance of the second differential amplifier.

The voltage summing buffer may further include a third differential amplifier configured to receive first and second voltages of a second differential input voltage as a third differential input to generate a third differential current to the summing node pair.

The voltage summing buffer may include a P-type differential amplifier coupled between a first power supply voltage and a first summing node pair, the P-type differential amplifier being configured to receive the output voltage as feedback and receive the upper voltage, the fedback output voltage and the upper voltage being received as a first differential input, to generate a first differential current to the first summing node pair, the P-type differential amplifier being configured to receive the positive voltage and the negative voltage of the lower differential voltage as a second differential input to generate a second differential current to the first summing node pair, an N-type differential amplifier coupled between a second power supply voltage and a second summing node pair, the N-type differential amplifier being configured to receive the output voltage as feedback and receive the upper voltage, the fedback output voltage and the upper voltage being received as a third differential input, to generate a third differential current to the second summing node pair, the N-type differential amplifier being configured to receive the lower differential voltage as a fourth differential input to generate a fourth differential current to the second summing node pair, and an output buffer configured to generate the output voltage based on a sourcing differential current at the first summing node pair and a sinking differential current at the second summing node.

The P-type differential amplifier may be enabled in response to a switch signal and the N-type differential amplifier may be enabled in response to an inversion signal of the switch signal, the switch signal being activated when a value of the upper bits is smaller than a center value of the upper bits.

Embodiments are also directed to a voltage summing buffer, including a first differential amplifier configured to receive an output voltage and a single-ended input voltage as a first differential input to generate a first differential current to a summing node pair, a second differential amplifier configured to receive first and second voltages of a first differential input voltage as a second differential input to generate a second differential current to the summing node pair, and an output buffer configured to generate the output voltage based on a voltage or a current at one of the summing node pair.

The first differential input voltage may have a level for compensating an offset of the single-ended input voltage.

The voltage summing buffer may further include a third differential amplifier configured to receive first and second voltages of a second differential input voltage as a third differential input to generate a third differential current to the summing node pair.

Embodiments are also directed to a source driver of a display device, the source driver including a reference voltage generator configured to generate upper reference voltages and lower reference voltages, and a plurality of digital-to analog converters configured to convert a plurality of digital signals to a plurality of output voltages, respectively. Each digital-to analog converter may include a first decoder configured to receive upper bits of each digital signal and the upper reference voltages to output an upper voltage corresponding to the upper bits, a second decoder configured to receive lower bits of each digital signal and the lower reference voltages to output a lower differential voltage corresponding to the lower bits, and a voltage summing buffer configured to generate each output voltage of the plurality of output voltages based on the upper voltage and the lower differential voltage, each output voltage of the plurality of output voltages corresponding to one of the digital signals of the plurality of digital signals including the upper bits and the lower bits.

The reference voltage generator may include an upper reference voltage generator configured to generate $2^n$ upper reference voltages with respect to n upper bits, n being a positive integer, the $2^n$ upper reference voltages being uniformly spaced by a first voltage amount, and a lower reference voltage generator configured to generate $2^{n-1}+1$ lower reference voltages with respect to m lower bits, m being a positive integer, the $2^{n-1}+1$ lower reference voltages being uniformly spaced by a second voltage amount smaller than the first voltage amount.

The source driver may further include a gamma correction circuit configured to receive a serial data signal and perform a gamma correction on the serial data signal to output a corrected serial data signal, and a latch circuit configured to latch the corrected serial data signal sequentially and deserialize the latched values to generate the plurality of digital signals provided to the digital-to analog converters.

Embodiments are also directed to a display device including a source driver according to an embodiment.

The display device may further include a gate driver. The gate driver may be configured to drive row lines of a display panel, and the source driver may be configured to drive column lines of the display panel.

The display panel may include a plurality of pixels, the pixels being arranged in a matrix, each pixel including at least one transistor having a gate coupled to a row line and having an electrode coupled to a column line, and a serial data signal may be provided to the source driver, the serial data signal being converted by the source driver, the source driver outputting analog output voltages to the column lines so as to display images corresponding to the serial data signal.

BRIEF DESCRIPTION OF THE DRAWINGS

Features will become apparent to those of skill in the art by describing in detail example embodiments with reference to the attached drawings in which:

FIG. 4 illustrates a table of levels of a lower differential voltage output from the second decoder of FIG. 3.

FIG. 16 illustrates a block diagram of an interface employable in the computing system of FIG. 15.

DETAILED DESCRIPTION

Figure 1:
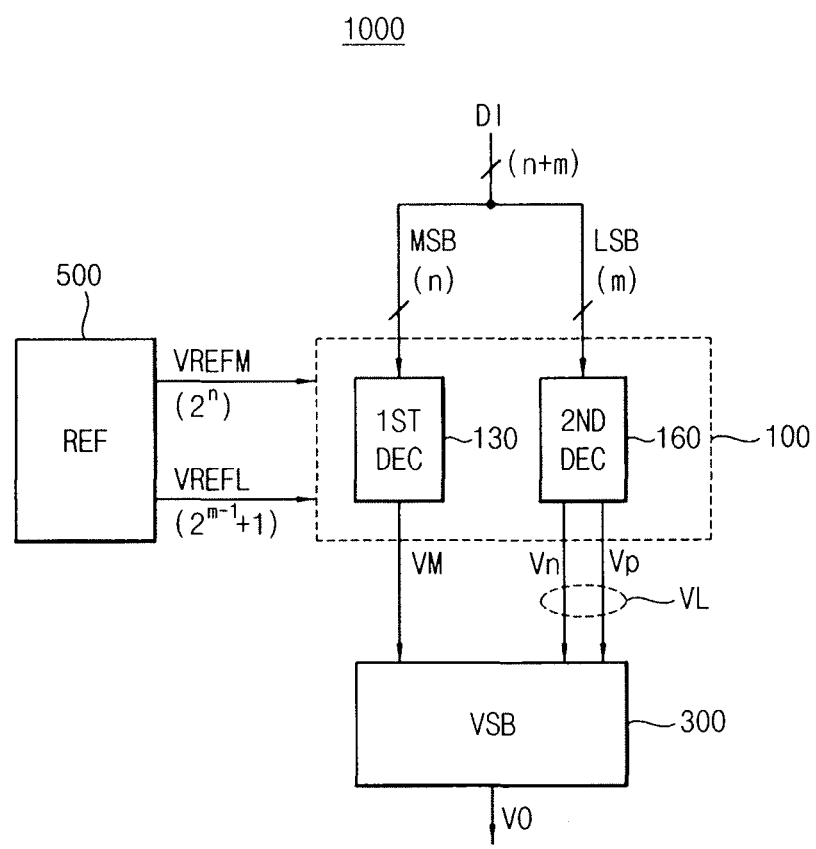
FIG. 1 illustrates a block diagram of a digital-to-analog converter according to example embodiments.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. Like reference numerals refer to like elements throughout.

It will be understood that, although the terms first, second, third, etc., may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present inventive concept. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 illustrates a block diagram of a digital-to-analog converter according to example embodiments.

Referring to FIG. 1, a digital-to-analog converter 1000 may include a decoder circuit 100 and a voltage summing buffer (VSB) 300. The decoder circuit 100 may include a first decoder 130 and a second decoder 160.

In the example embodiment shown in FIG. 1, the first decoder 130 receives upper bits MSB of a digital signal DI and upper reference voltages VREFM to output an upper voltage VM corresponding to the upper bits MSB. The second decoder 160 receives lower bits LSB of the digital signal DI and lower reference voltages VREFL to output a lower differential voltage VL (including negative and positive voltages Vn, Vp, described below) corresponding to the lower bits LSB. The voltage summing buffer 300 generates an output voltage VO based on the upper voltage VM and the lower differential voltage VL such that the output voltage VO corresponds to the digital signal DI including the upper bits MSB and the lower bits LSB.

The digital-to-analog converter 1000 may further include a reference voltage generator circuit 500. As will be described with reference to FIGS. 2 and 3, the reference voltage generator circuit 500 may include an upper reference voltage generator 530 configured to generate the upper reference voltages VREFM and a lower reference voltage generator 560 configured to generate the lower reference voltages VREFL.

For example, when the number of the upper bits MSB is six, that is, n=6, the upper reference voltage generator 530 may generate 64 ($=2^6$) upper reference voltages VREFM0 through VREFM63, and when the number of the lower bits LSB is four, that is, m=4, the lower reference voltage generator 560 may generate 9 ($=2^{4-1}+1$) lower reference voltages VREFL0 through VREF8.

The digital-to-analog converter 1000 according to example embodiments may divide the digital signal DI into the upper bits MSB and the lower bits LSB to sum the upper voltage VM and the lower voltage VL corresponding to the upper bits MSB and the lower bits LSB, respectively. Thus the number of voltage lines to provide the reference voltages may be reduced. As described below, the number of the reference voltage lines may be further reduced using the lower differential voltage VL including a positive voltage Vp and a negative voltage Vn.

Figure 2:
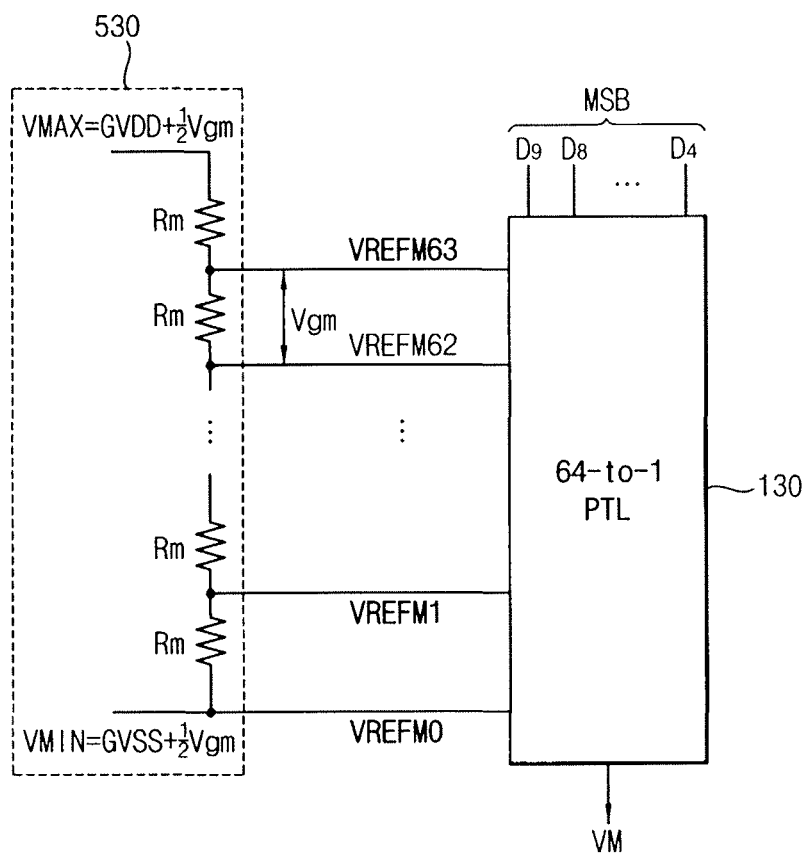
FIG. 2 illustrates a diagram of an example of an upper reference voltage generator and a first decoder in the digital-to-analog converter of FIG. 1.

FIG. 2 illustrates a diagram of an example of an upper reference voltage generator and a first decoder in the digital-to-analog converter of FIG. 1.

Referring to FIG. 2, the upper reference voltage generator 530 may generate the $2^n$ upper reference voltages VREFM with respect to the n upper bits MSB, where n is a positive integer, and the $2^n$ upper reference voltages VREFM may be uniformly spaced by a first voltage amount Vgm, e.g., VREFM63−VREFM62=Vgm, VREFM62−VREFM61=Vgm, etc. The first decoder 130 may select one of the upper reference voltages VREFM in response to the upper bits MSB to output the selected upper reference voltage as the upper voltage VM.

FIG. 2 illustrates an example in which the number (n) of the upper bits MSB is six. In other implementations, the number of the upper bits MSB may be different. When the upper bits MSB includes six bits D9 through D4, that is, n=6, the upper reference voltage generator 530 may generate the 64 ($=2^6$) upper reference voltages VREFM0 through VREFM63 that are uniformly spaced by the first voltage amount Vgm as illustrated in FIG. 2. The first decoder 130 may select one of the 64 upper reference voltages VREFM0 through VREFM63 in response to the six upper bits D9 through D4 to output the selected upper reference voltage as the upper voltage VM. The first decoder 130 may be implemented with a pass transistor logic (PTL) that selects and outputs the upper reference voltage VM of a higher level as the value of the upper bits MSB is increased. For example, for the case that n=6, the minimum upper reference voltage VREFM0 may be selected when the value of the upper bits MSB is '000000', and the maximum upper reference voltage VREFM63 may be selected when the value of the upper bits MSB is '111111'.

The upper reference voltage generator 530 may be included in the reference voltage generator circuit 500 in FIG. 1. For example, the upper reference voltage generator 530 may be implemented using a plurality of resistors Rm coupled between a maximum voltage VMAX and a minimum voltage VMIN, as illustrated in FIG. 2.

As will be described below, the lower differential voltage VL may be varied within a range from −Vgm/2 to Vgm/2 and the output voltage VO may be varied within a range from GVDD=VMAX−Vgm/2 to GVSS=VMIN−Vgm/2.

Figure 3:
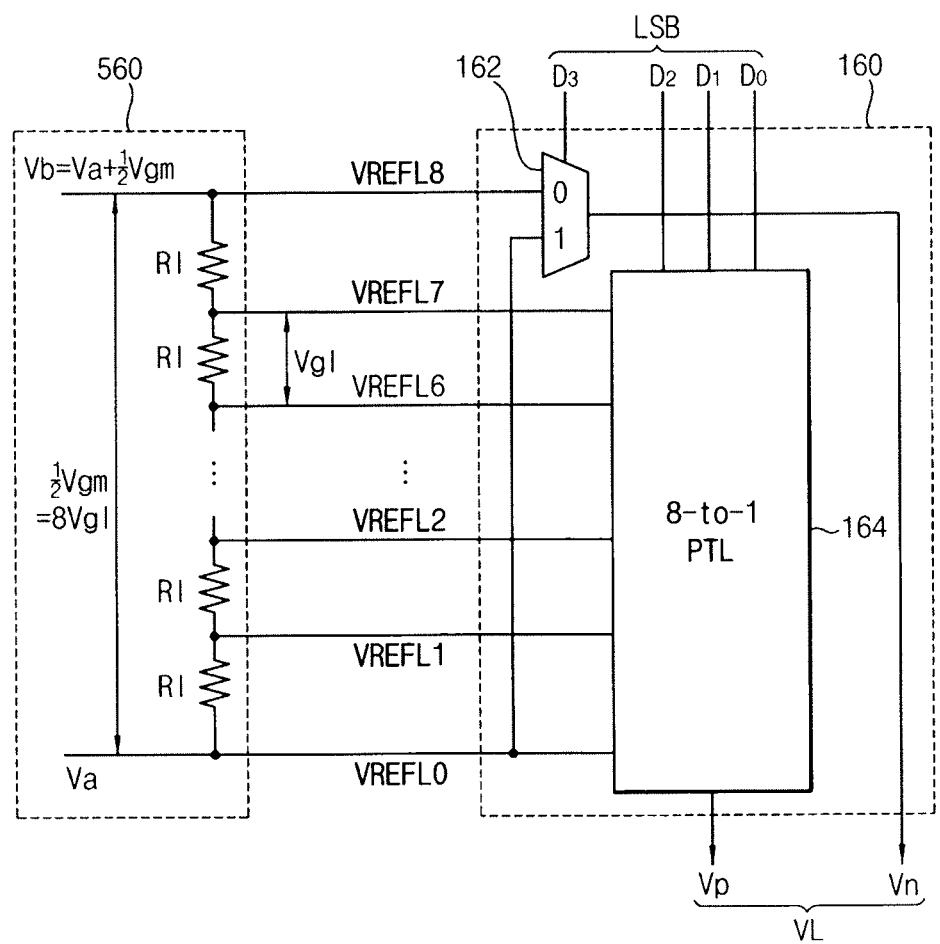
FIG. 3 illustrates a diagram of an example of a lower reference voltage generator and a second decoder in the digital-to-analog converter of FIG. 1.

FIG. 3 illustrates a diagram of an example of a lower reference voltage generator and a second decoder in the digital-to-analog converter of FIG. 1.

Referring to FIG. 3, the lower reference voltage generator 560 may generate the $2^{m-1}+1$ lower reference voltages VREFL with respect to the m lower bits LSB, where in is a positive integer, and the $2^{m-1}+1$ lower reference voltages VREFL may be uniformly spaced by a second voltage amount Vgl that is smaller than the first voltage amount Vgm. The second decoder 160 may select a positive voltage Vp and a negative voltage Vn among the lower reference voltages VREFL in response to the lower bits LSB to output the positive voltage Vp and the negative voltage Vn as the lower differential voltage VL.

FIG. 3 illustrates an example in which the number m of the lower bits LSB is four. In other implementations, the number of the lower bits LSB may be different. When the lower bits LSB include four bits D3 through D0, that is, m=4, the lower reference voltage generator 560 may generate the 9 ($=2^{4-1}+1$) lower reference voltages VREFL0 through VREFL8 that are uniformly spaced by the second voltage amount Vg1, as illustrated in FIG. 3. The second decoder 160 may select the positive voltage Vp and the negative voltage Vn from among the 9 lower reference voltages VREFL0 through VREFL8 in response to the four lower bits D3 through D0 to output the positive voltage Vp and the negative voltage Vn as the lower differential voltage VL.

The lower reference voltage generator 560 may be included in the reference voltage generator circuit 500 in FIG. 1. For example, the lower reference voltage generator 560 may be implemented using a plurality of resistors R1 coupled between a maximum voltage Vb and a minimum voltage Va as illustrated in FIG. 3.

In an implementation, the second decoder 160 may be implemented with a multiplexer 162 and a pass transistor logic (PTL) 164, as illustrated in FIG. 3.

The multiplexer 162 may select the maximum voltage VREFL8 or the minimum voltage VREFL0 among the lower reference voltages VREFL0 through VREFL8 in response to a most significant bit D3 of the lower bits D3 through D0 to output the selected voltage as the negative voltage Vn of the lower differential voltage VL. For example, the maximum lower reference voltage VREFL8 may be output as the negative voltage Vn when the most significant bit D3 is '0', and the minimum lower reference voltage VREFL0 may be output as the negative voltage Vn when the most significant bit D3 is '1'.

The pass transistor logic 164 may select one of the lower reference voltages VREFL0 through VREFL7 in response to the remaining bits D2 through D0 of the lower bits D3 through D0, i.e., the lower bits except the most significant bit D3, to output the selected voltage as the positive voltage Vp of the lower differential voltage VL. The pass transistor logic 164 may select and output the positive voltage Vp of a higher level as the value of the remaining bits D2 through D0 is increased. For example, for a case where m=4 and the lower bits are D3 through D0, the minimum lower reference voltage VREFL0 may be selected when the value of the remaining bits D2 through D0 is '000', and the lower reference voltage VREFL7 may be selected when the value of the remaining bits D2 through D0 is '111'.

The level of the lower differential voltage VL may be determined according to the lower bits D3 through D0, as illustrated in FIG. 4.

FIG. 4 illustrates a table of levels of a lower differential voltage output from the second decoder of FIG. 3.

As shown in FIG. 4, the lower differential voltage VL (=Vp−Vn) may be sequentially increased by the second voltage amount Vg1 from −8Vg1 to 7Vg1 as the base-10 value of the data represented by the lower bits D3 through D0 is increased by a base-10 amount=one.

For example, when the resistor Rm in the upper reference voltage generator 530 in FIG. 2 and the resistor R1 in the lower reference voltage generator 560 in FIG. 3 satisfy the relation, Rm=16*R1, and the maximum voltage Vb and the minimum voltage Va of the lower reference voltage generator 560 satisfy the relation, Vb−Va=Vgm/2, then the first voltage amount Vgm and the second voltage amount Vg1 satisfy the relation, Vgm=16*Vg1. The four lower bits D3 through D0 may represent the voltage range 15*Vg1 uniformly spaced by the second voltage amount Vg1. As such, the lower differential voltage VL may be sequentially increased by Vg1 from −Vgm/2 to Vgm/2 according as the value of the lower bits D3 through D0 is increased by one, where Vgm is the first voltage amount and Vg1 is the second voltage amount.

Referring to FIGS. 1 through 4, the output voltage VO corresponds to the sum VM+VL of the upper voltage VM and the lower voltage VL, and thus the output voltage VO may be represented as the voltages between GVDD (=VMAX−Vgm/2) and GVSS (=VMIN−Vgm/2) uniformly spaced by the second voltage amount Vg1. Thus, the digital values from '0000000000' to '1111111111' of the digital signal DI including the upper and lower bits D9 through D0 may be converted to the analog voltages uniformly spaced by the second voltage amount Vg1.

Figure 5:
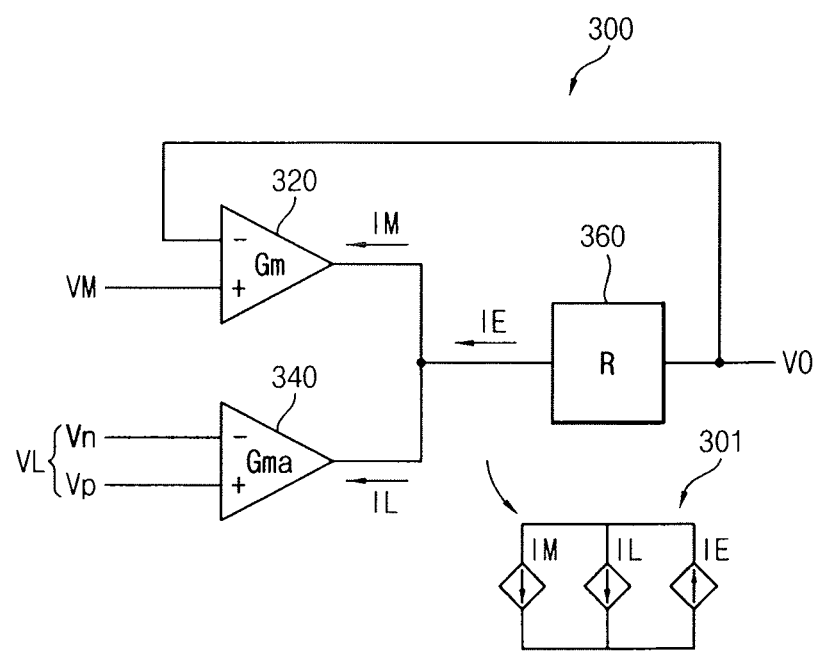
FIG. 5 illustrates a diagram for describing a configuration and an operation of a voltage summing buffer according to example embodiments.

FIG. 5 illustrates a diagram for describing a configuration and an operation of a voltage summing buffer according to example embodiments.

Referring to FIG. 5, a voltage summing buffer 300 may include a first differential amplifier 320, a second differential amplifier 340, and an output buffer 360.

The first differential amplifier 320 may receive the output voltage VO as feedback at the negative terminal (−) and may receive the upper voltage VM at the positive terminal (+). The second differential amplifier 340 may receive the negative voltage Vn of the lower differential voltage VL at the negative terminal (−) and may receive the positive voltage Vp of the lower differential voltage VL at the positive terminal (+). The output buffer 360 may generate the output voltage VO based on the sum of the outputs of the first and second differential amplifiers 320 and 340. Referring to the equivalent circuit 301 illustrated in the bottom portion of FIG. 5, a first current IM, a second current IL and a summed current IE may be represented as following Expression 1.

$$IM=(VM-VO)*Gm,$$

$$IL=VL*Gma,$$

$$IE=-VO/R \quad \text{(Expression 1)}$$

In Expression 1, Gm indicates a transconductance of the first differential amplifier 320, Gma indicates a transconductance of the second differential amplifier 340, and R indicates a transimpedance of the output buffer 360.

Using Expression 1 and the relation IM+IL=IE, following Expression 2 may be obtained.

$$VO*(1-1/(Gm*R))=VM+VL*(Gma/Gm) \quad \text{(Expression 2)}$$

The loop gain Gm*R has a relatively large value greater than $10^4$. Thus, the term 1/(Gm*R) may be neglected and thus Expression 2 may be approximated to Expression 3.

$$VO=VM+VL*(Gma/Gm) \quad \text{(Expression 3)}$$

If the transconductance Gm of the first differential amplifier 320 and the transconductance Gma of the second differential amplifier 340 are set to be identical to each other, the result of Expression 4 may be obtained.

$$VO=VM+VL \quad \text{(Expression 4)}$$

As a result, the output voltage VO may correspond to the sum VM+VL of the upper voltage VM and the lower differential voltage VL by setting the transconductance Gm of the first differential amplifier 320 and the transconductance Gma of the second differential amplifier 340 to be identical to each other.

As such, the voltage summing buffer 300 according to example embodiments may sum the voltages VM and VL using the differential amplifiers 320 and 340 having the same operational characteristics.

The voltage summing buffer 300 of FIG. 5 may be used to sum arbitrary voltages. Thus, the upper voltage VM and the lower differential voltage VL may be unrelated to the upper bits and the lower bits of the digital signal DI, and the upper voltage VM may be any single-ended voltage and the lower differential voltage VL may be any differential voltage. In some example embodiments, the differential voltage VL may be used as a compensation voltage for compensating an offset of the single-ended voltage VM. The offset of the single-ended voltage VM may be removed by appropriately adjusting the level of the differential voltage VL to generate the compensated output voltage VO.

Figure 6:
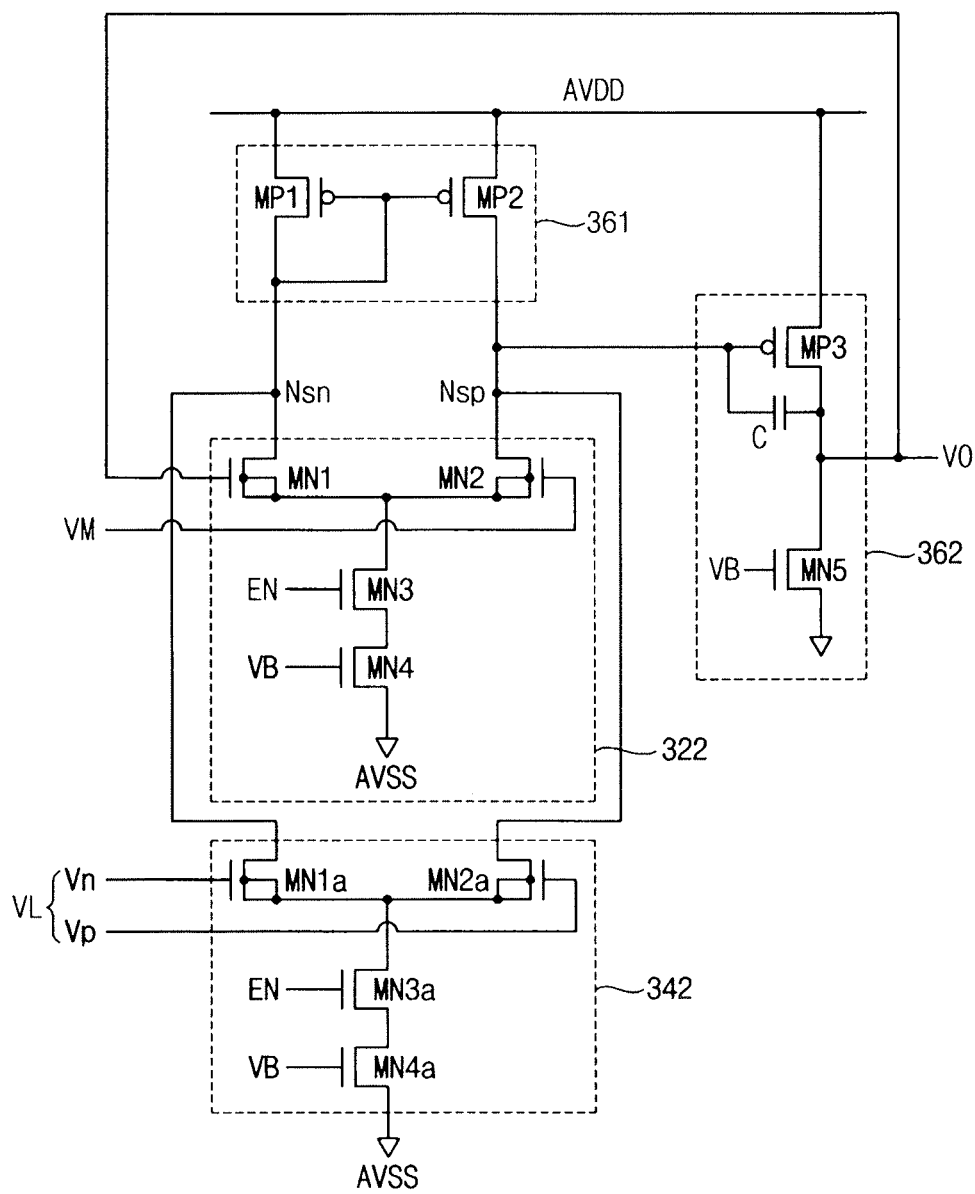
FIG. 6 illustrates a circuit diagram of a voltage summing buffer according to an example embodiment.

FIG. 6 illustrates a circuit diagram of a voltage summing buffer according to an example embodiment.

Referring to FIG. 6, a voltage summing buffer 300a may include a first differential amplifier 322, a second differential amplifier 342, and an output buffer 362.

The first differential amplifier 322 may receive an output voltage VO and an upper voltage VM as a first differential input to generate a first differential current to a summing node pair Nsn and Nsp. The second differential amplifier 342 may receive a lower differential voltage VL as a second differential input to generate a second differential current to the summing node pair Nsn and Nsp. The output buffer may generate the output voltage VO based on a voltage or a current of at least one node of the summing node pair Nsn and Nsp. FIG. 6 illustrates an example that the output buffer 362 generates the output voltage VO based on the voltage of the positive node Nsp of the summing node pair Nsn and Nsp.

A current mirror 361 may be coupled between a first voltage AVDD and the summing node pair Nsn and Nsp. The first differential amplifier 322 and the second differential amplifier 342 may be coupled in parallel to each other between the summing node pair Nsn and Nsp and a second voltage AVSS. The first voltage AVDD may be a power supply voltage and the second voltage AVSS may be a ground voltage.

The current mirror 361 may include PMOS transistors MP1 and MP2. The first differential amplifier 322 may include a first differential input transistor pair MN1 and MN2 and a first current source MN3 and MN4. The first differential input transistor pair MN1 and MN2 may receive the upper voltage VM and the output voltage VO at the gates thereof, and the first current source MN3 and MN4 may be controlled in response to an enable signal EN and a bias voltage VB at gates of MN3 and MN4. The second differential amplifier 342 may include a second differential input transistor pair MN1a and MN2a and a second current source MN3a and MN4a. The second differential input transistor pair MN1a and MN2a may receive, at the gates thereof, the negative voltage Vn and the positive voltage Vp of the lower differential voltage VL and the second current source MN3a and MN4a may be controlled in response to the enable signal EN and the bias voltage VB.

As described with reference to FIG. 5, the transconductance Gm of the first differential amplifier 322 and the transconductance Gina of the second differential amplifier 342 may be set to be identical to each other, e.g., using the transistors of the same operational characteristics and the same bias voltage, and thus the output buffer 362 may generate the output voltage VO corresponding to the sum of the upper voltage VM and the lower differential voltage VL.

In an implementation, the output buffer 362 may be implemented with a voltage-to-voltage amplifier including transistors MP3 and NM5 and a capacitor C, as illustrated in FIG. 6.

When the upper voltage VM varies in a relatively large range and the lower differential voltage VL varies in a relatively small range, a body effect of the transistors MN1, MN2, MN1a, and MN2a for differential inputs and a channel length modulation effect of the current sources may be caused. To reduce such undesirable effects, the source and the body of each of the transistors MN1, MN2, MN1a, and MN2a may be electrically coupled together, and each current source may include two or more cascode-coupled transistors MN3/MN4 and MN3a/MN4a, as illustrated in FIG. 6.

Figure 7:
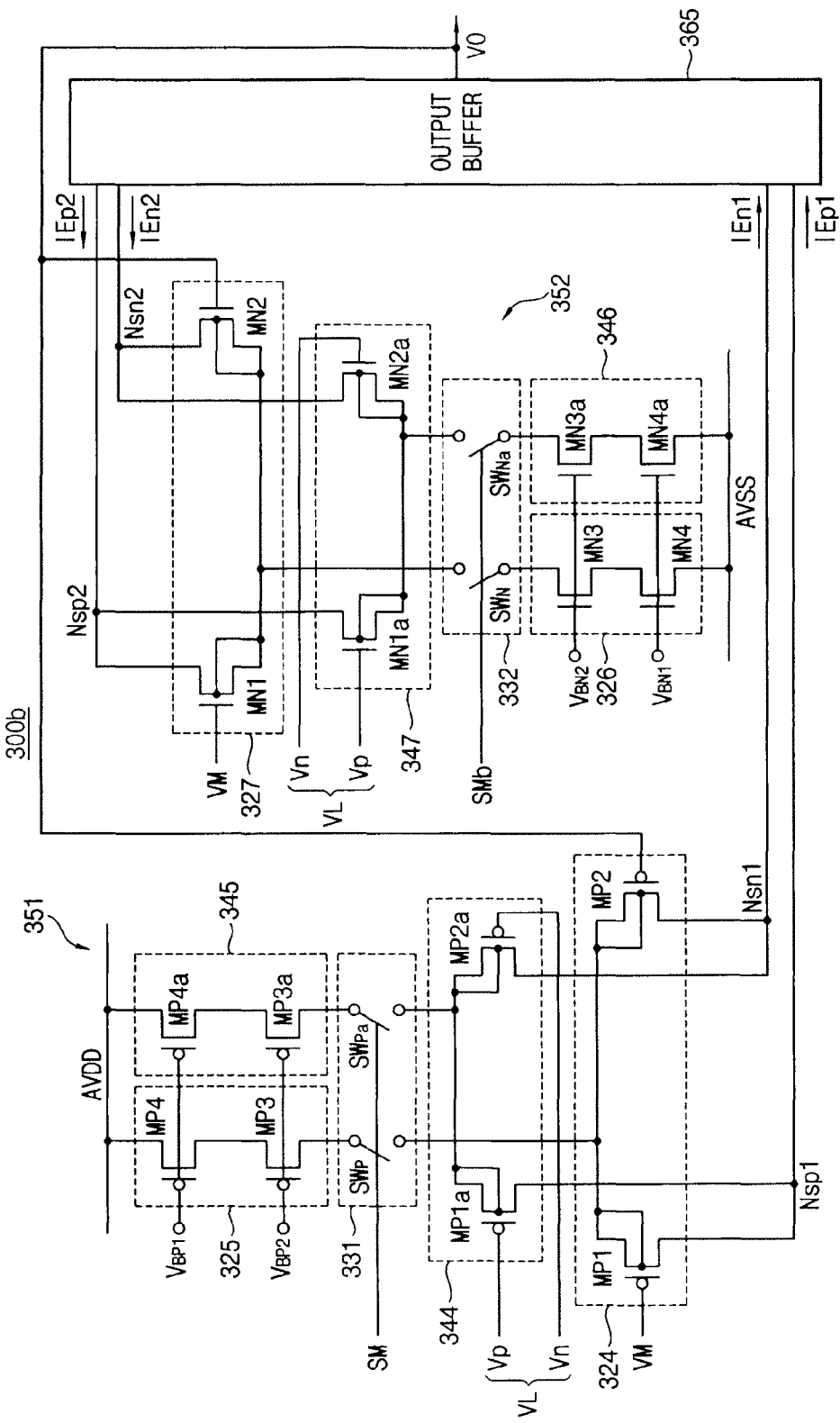
FIG. 7 illustrates a circuit diagram of a voltage summing buffer according to another example embodiment.

FIG. 7 illustrates a circuit diagram of a voltage summing buffer according to another example embodiment.

Referring to FIG. 7, a voltage summing buffer 300b may include a P-type differential amplifier 351, an N-type differential amplifier 352, and an output buffer 365.

The P-type differential amplifier 351 may be coupled between a first power supply voltage AVDD and a first summing node pair Nsn1 and Nsp1. The P-type differential amplifier 351 may receive the fedback output voltage VO and the upper voltage VM as a first differential input to generate a first differential current to the first summing node pair Nsn1 and Nsp1, and may receive the lower differential voltage VL as a second differential input to generate a second differential current to the first summing node pair Nsn1 and Nsp1.

The N-type differential amplifier 352 may be coupled between a second power supply voltage AVSS and a second summing node pair Nsn2 and Nsp2. The N-type differential amplifier 352 may receive the fedback output voltage VO and the upper voltage VM as a third differential input to generate a third differential current to the second summing node pair Nsn2 and Nsp2, and may receive the lower differential voltage VL as a fourth differential input to generate a fourth differential current to the second summing node pair Nsn2 and Nsp2.

The output buffer 365 may generate the output voltage VO based on a sourcing differential current IEn1 and IEp1 at the first summing node pair Nsn1 and Nsp1 and a sinking differential current IEn2 and IEp2 at the second summing node Nsn2 and Nsp2, where the sourcing differential current IEn1 and IEp1 corresponds to the sum of the first differential current, and the second differential current and the sinking differential current IEn2 and IEp2 corresponds to the sum of the third differential current and the fourth differential current.

The P-type differential amplifier 351 may include a first differential amplifier, configured to generate the first differential current to the first summing node pair Nsn1 and Nsp1, and a second differential amplifier, configured to generate the second differential current to the first summing node pair Nsn1 and Nsp1. The first differential amplifier may include a first differential input transistor pair 324 and a first current source 325. The first differential input transistor pair 324 may receive the upper voltage VM and the fedback output voltage VO, and the first current source 325 may be controlled in response to a first bias voltage VBP1 and a second bias voltage VBP2. The second differential amplifier may include a second differential input transistor pair 344 and a second current source 345. The second differential input transistor pair 344 may receive the positive voltage Vp and the negative voltage Vn of the lower differential voltage VL and the second current source 345 may be controlled in response to the first bias voltage VBP1 and the second bias voltage VBP2. A first switch unit 331 may be included between the current sources 325 and 345 and the differential input transistor pairs 324 and 344, and the P-type differential amplifier 351 may be enabled in response to a switch signal SM.

When the upper voltage VM varies in a relatively large range and the lower differential voltage VL varies in a relatively small range, a body effect of the transistors MP1, MP2, MP1a, and MP2a for differential inputs and a channel length modulation effect of the current sources 325 and 345 may be caused. To reduce such undesirable effects, the source and the body of each of the transistors MP1, MP2, MP1a, and MP2a for differential inputs may be electrically coupled together, and each of the current sources 325 and 345 may include two or more cascode-coupled transistors MP3/MP4 and MP3a/MP4a, as illustrated in FIG. 7.

The N-type differential amplifier 352 may include a third differential amplifier configured to generate the third differential current to the second summing node pair Nsn2 and Nsp2, and may include a fourth differential amplifier configured to generate the fourth differential current to the second summing node pair Nsn2 and Nsp2. The third differential amplifier may include a third differential input transistor pair 327 and a third current source 326. The third differential input transistor pair 327 may receive the upper voltage VM and the fedback output voltage VO, and the third current source 326 may be controlled in response to a third bias voltage VBN1 and a fourth bias voltage VBN2. The fourth differential amplifier may include a fourth differential input transistor pair 347 and a fourth current source 346. The fourth differential input transistor pair 347 may receive the positive voltage Vp and the negative voltage Vn of the lower differential voltage VL, and the fourth current source 346 may be controlled in response to the third bias voltage VBN1 and the fourth bias voltage VBN2'. A second switch unit 332 may be included between the current sources 326 and 346 and the differential input transistor pairs 327 and 347, and the N-type differential amplifier 352 may be enabled in response to an inversion signal SMb of the switch signal SM (SMb representing SM bar, an inverted signal of the switch signal SM).

In the same way as the P-type differential amplifier 351, to reduce the body effect and the channel length modulation effect of the N-type differential amplifier 352, the source and the body of each of the transistors MN1, MN2, MN1a, and MN2a for differential inputs may be electrically coupled together, and each of the current sources 326 and 346 may include two or more cascode-coupled transistors MN3/MN4 and MN3a/MN4a, as illustrated in FIG. 7.

The switch signal SM may be activated when a value of the upper bits MSB is smaller than a center value of the upper bits MSB. For example, for a case where the bit number of the upper bits MSB is six (e.g., $bit_n bit_{n-1} bit_{n-2} bit_{n-3} bit_{n-4} bit_{n-5}$), the switch signal SM may be activated when the value of the upper bits MSB is smaller than the center value '111000' (i.e., the respective bit values of $bit_n bit_{n-1} bit_{n-2}$ are less than 111, e.g., 110). As such, the voltage summing buffer 300b may provide a rail-to-rail output using the P-type differential amplifier 351 and the N-type differential amplifier 352 that are enabled complementarily by the switches SWp and SWpa in the first switch unit 331 (which are turned on in response to the switch signal SM) and the switches SWn and SWna in the second switch unit 332 (which are turned on in response to the inversion signal SMb of the switch signal SM).

Figure 8:
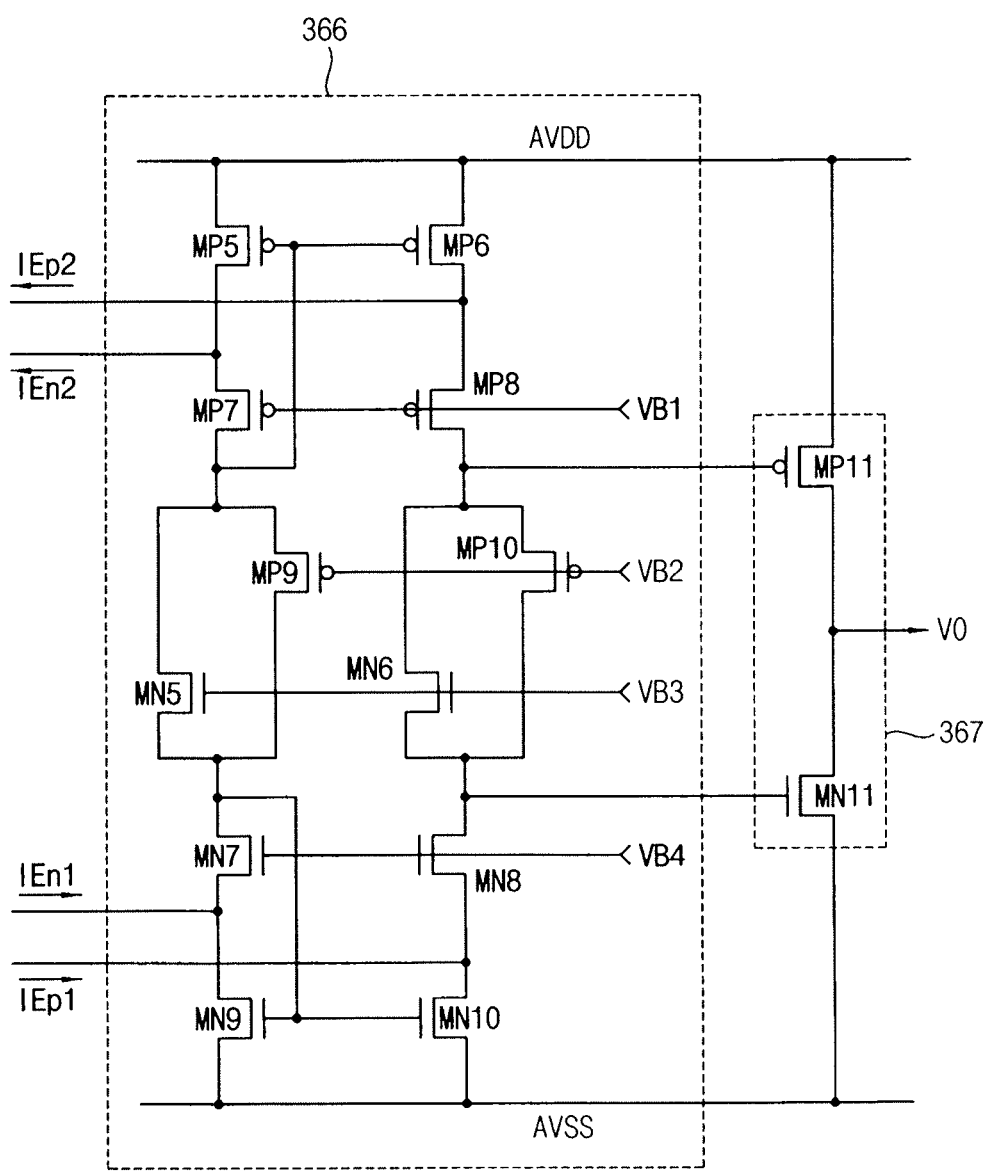
FIG. 8 illustrates a circuit diagram of an example of an output buffer in the voltage summing buffer of FIG. 7.

FIG. 8 illustrates a circuit diagram of an example of an output buffer in the voltage summing buffer of FIG. 7.

Referring to FIG. 8, an output buffer 365a may include an amplifying unit 366 and a driving unit 367. The output buffer 365a may be implemented using a plurality of PMOS transistors MP5 through MP11 and a plurality of NMOS transistors MN5 through MN11 coupled between the first power supply voltage AVDD and the second power supply voltage AVSS.

The amplifying unit 366 may perform current-to-voltage conversion and amplification based on the sourcing differential current IEn1 and IEp1 output at the first summing node pair Nsn1 and Nsp1 of FIG. 7 and the sinking differential current IEn2 and IEp2 at the second summing node Nsn2 and Nsp2 of FIG. 7. The driving unit 367 may generate the output voltage VO using the pull-up transistor MP11 and the pull-down transistor MN11 operating in response to the voltages provided from the amplifying unit 366.

FIG. 8 illustrates an example configuration of the output buffer 365a for understanding of the overall operation of the voltage summing buffer of FIG. 7. In other implementations, the configuration of the output buffer 365a may be different.

Figure 9:
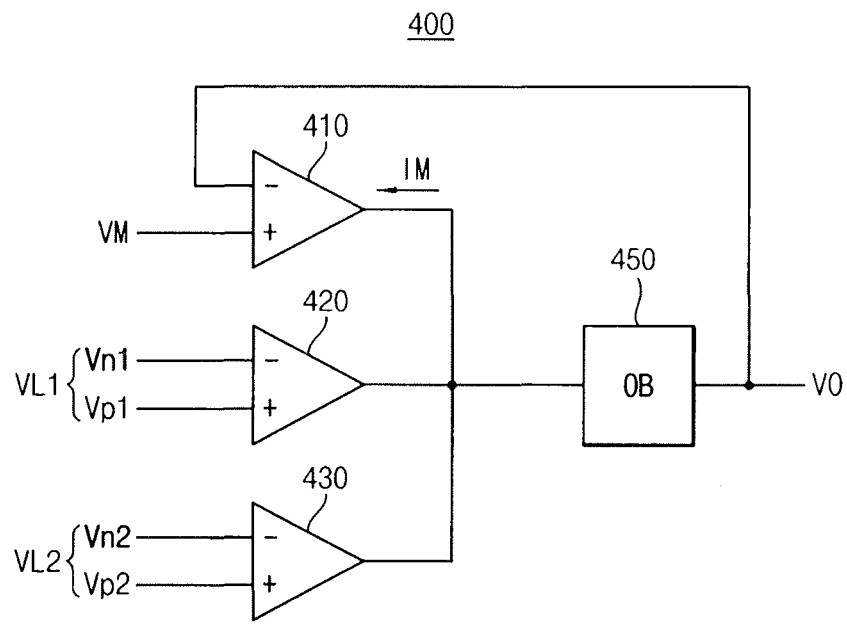
FIG. 9 illustrates a block diagram of a voltage summing buffer according to example embodiments.

FIG. 9 illustrates a block diagram of a voltage summing buffer according to example embodiments.

Referring to FIG. 9, a voltage summing buffer 400 may include a first differential amplifier 410, a second differential amplifier 420, a third differential amplifier 430, and an output buffer 450.

The first differential amplifier 410 may receive a output voltage VO as feedback at a negative terminal (−) and may receive a single-ended input voltage VM at a positive terminal (+). The second differential amplifier 420 may receive a negative voltage Vn1 of a first differential input voltage VL1 at a negative terminal (−) and may receive a positive voltage Vp1 of the first differential input voltage VL1 at a positive terminal (+). The third differential amplifier 430 may receive a negative voltage Vn2 of a second differential input voltage VL2 at a negative terminal (−) and may receive a positive voltage Vp2 of the second differential input voltage VL2 at a positive terminal (+). The output buffer 450 may generate the output voltage VO based on the sum of the outputs of the first, second, and third differential amplifiers 410, 420, and 430.

As described above with reference to FIGS. 5, 6 and 7, the first differential amplifier 410 may receive the fedback output voltage VO and the single-ended input voltage VM as a first differential input to generate a first differential current to a summing node pair. The second differential amplifier 420 may receive the first differential input voltage VL1 as a second differential input to generate a second differential current to the summing node pair. The third differential amplifier 430 may receive the second differential input voltage VL2 as a third differential input to generate a third differential current to the summing node pair.

Compared with the voltage summing buffer 300 of FIG. 5, the voltage summing buffer 400 of FIG. 9 further includes the third differential amplifier 430. As described above, the bits of the digital signal DI may be divided into the upper bits MSB and the lower bits LSB, and then the upper voltage VM corresponding to the upper bits MSB and the lower differential voltage VL corresponding to the lower bits LSB may be summed by the voltage summing buffer 300 of FIG. 5. In some example embodiments, the bits of the digital signal DI may be further divided into upper bits MSB, first lower bits LSB1, and second lower bits LSB1, and then the single-ended input voltage VM (corresponding to the upper bits MSB), the first differential input voltage VL1 (corresponding to the first lower bits LSB1), and the second differential voltage VL2 (corresponding to the second lower bits LSB2) may be summed by the voltage summing buffer 400 of FIG. 9.

It will be understood that the illustrated embodiments of FIGS. 5 and 9, for summing two and three voltages, respectively, are merely examples. In other implementations, a voltage summing buffer according to example embodiments may include four or more differential amplifiers to sum four or more voltages.

Figure 10:
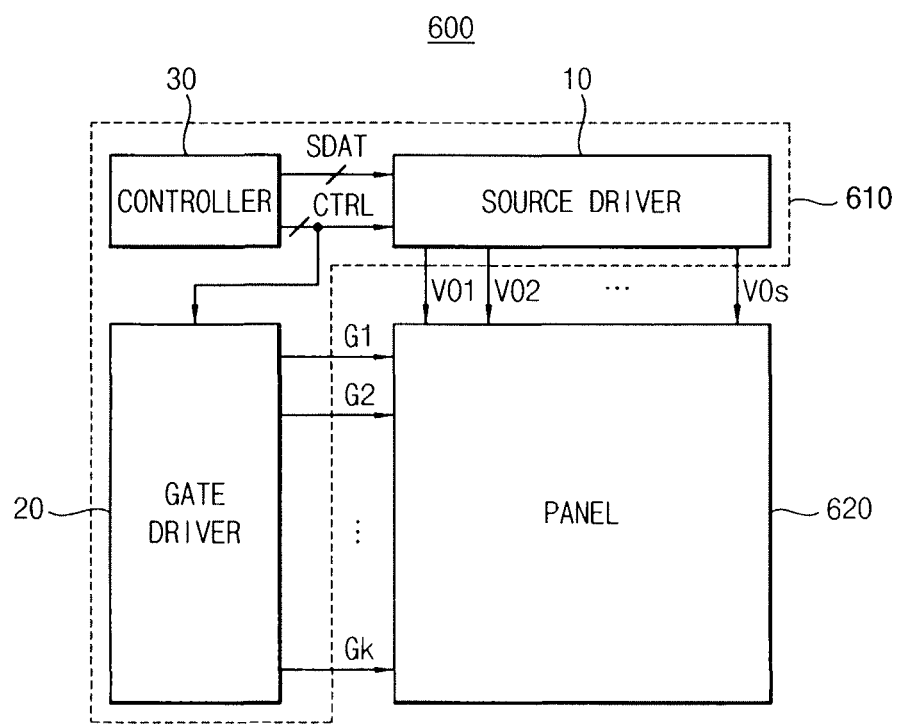
FIG. 10 illustrates a block diagram of a display device according to example embodiments.
Figure 11:
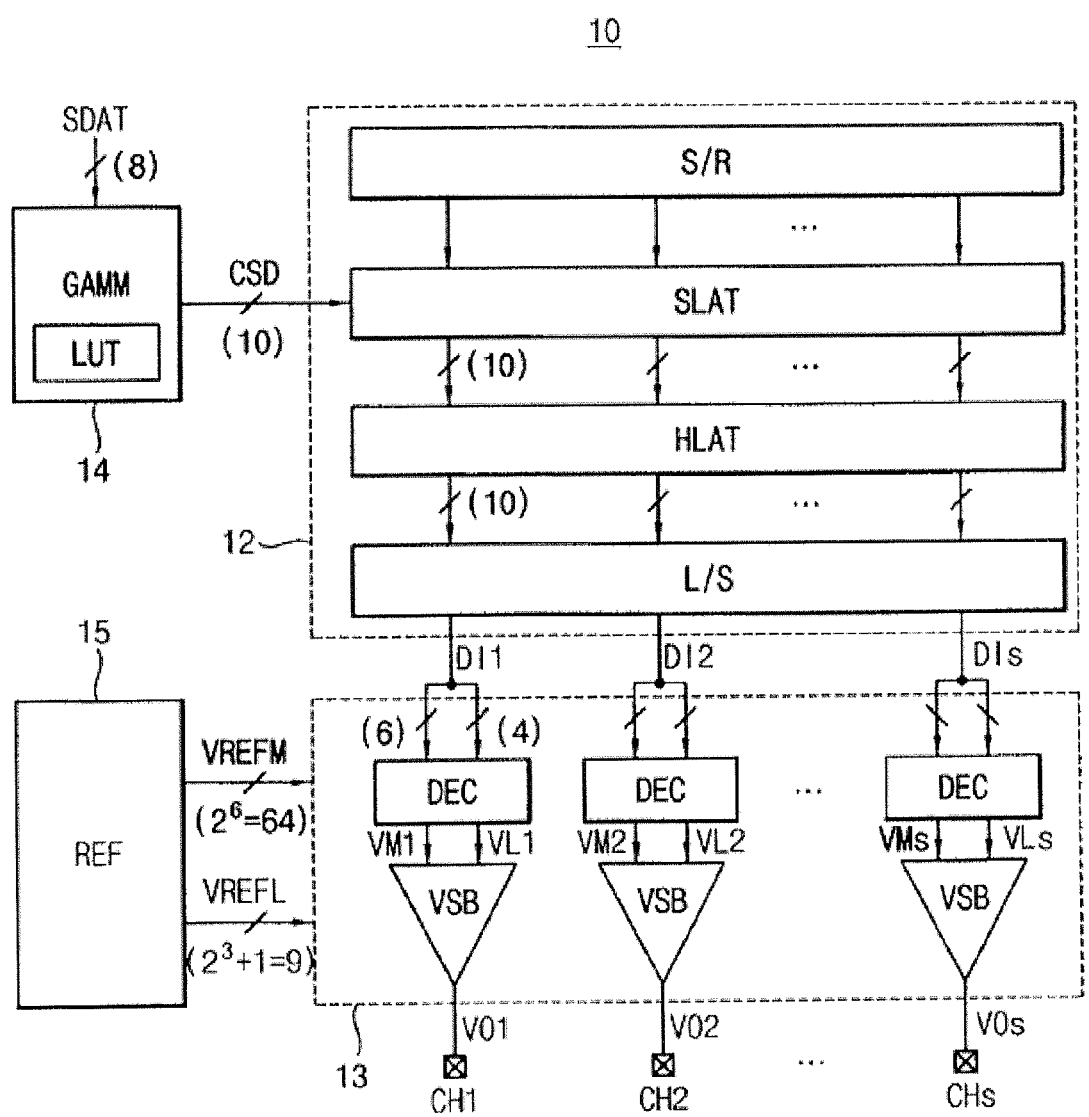
FIG. 11 illustrates a block diagram of a source driver in the display device of FIG. 10.

FIG. 10 illustrates a block diagram of a display device according to example embodiments, and FIG. 11 illustrates a block diagram of a source driver in the display device of FIG. 10.

Referring to FIG. 10, a display device 600 may include a display driver integrated circuit (DDI) 610 and a display panel 620. The DDI 610 may include a source driver 10, a gate driver 20, and a controller 30. Although not illustrated in FIG. 10, the DDI 610 may further include a power supply, an embedded memory, an interface circuit, etc.

The display panel 620 may include a plurality of pixels arranged in a matrix form. For example, each pixel in the display panel 620 may include an active element or a switching element. In an implementation, the display device 600 may be an active matrix liquid crystal display (AMLCD) device.

The controller 30 may generate control signals CTRL for controlling the source driver 10 and the gate driver 20, and may provide a serial data signal SDAT to the source driver 10. The gate driver 20 may generate signals G1 through Gk in response to the control signals CTRL to turn on and off the switching elements in the pixels of the display panel 620. The source driver 10 may generate analog output voltages VO1 through VOs in response to the control signals CTRL to display images corresponding to the serial data signal SDAT.

Referring to FIG. 11, the source driver 10 may include a latch circuit 12, a converter circuit 13, a gamma correction circuit 14, and a reference voltage generator 15.

The gamma correction circuit 14 may receive the serial data signal SDAT (of, e.g., 8 bits per pixel) and perform a gamma correction on the serial data signal SDAT to output a corrected serial data signal CSD (of, e.g., 10 bits per pixel). For example, the gamma correction circuit 14 may perform the gamma correction referring to a stored lookup table (LUT).

The latch circuit 12 may latch the corrected serial data signal CSD sequentially and deserialize the latched values to generate the digital signals DI1 through DIs. The latch circuit 12 may include a shift register S/R, a sampling latch SLAT, a holding latch HLAT, and a level shifter L/S. The corrected serial data signal CSD may be input to the sampling latch SLAT to be sequentially latched under control of the shift register S/R. After the sampling operation of the sampling latch SLAT is completed with respect to one row, the outputs of the sampling latch SLAT may be simultaneously latched by the holding latch HLAT. The level shifter L/S may adjust the voltage levels of the outputs of the holding latch HLAT to provide the digital signals DI1 through DI2 to the converter circuit 13.

The reference voltage generator 15 may generate the upper reference voltages VREFM and the lower reference voltages VREFL as described above. For example, the number of the upper reference voltages VREFM may be 64 ($=2^6$) and the number of the lower reference voltages VREFL may be 9 ($=2^{4-1}+1$) when each digital signal is divided into six upper bits and four lower bits.

The converter circuit 13 may convert the digital signals DI1 through DIs to the analog output voltages VO1 through VOs based on the upper reference voltages VREFM and the lower reference voltages VREFL, and may provide the output voltages VO1 through VOs to channels CH1 through CHs, respectively.

The converter circuit 13 may include a plurality of digital-to analog converters and each digital-to-analog converter may include a decoder circuit DEC, which includes the first decoder, the second decoder, and the voltage summing buffer VSB as described above according to embodiments. The first decoder in each digital-to-analog converter DEC may receive the upper bits (e.g., six bits) of each digital signal DIj (j=1, 2, . . . , s) and the upper reference voltages VREFM to output an upper voltage VMj corresponding to the upper bits. The second decoder in each digital-to-analog converter DEC may receive the lower bits (e.g., four bits) of each digital signal DIj and the lower reference voltages VREFL to output a lower differential voltage VLj corresponding to the lower bits. The voltage summing buffer VSB may generate each output voltage VOj based on the upper voltage VMj and the lower differential voltage VLj, and each output voltage VOj may correspond to the each digital signal DIj including the upper bits and the lower bits.

As described above, the reference voltage generator 15 may include the upper reference voltage generator and the lower reference voltage generator. The upper reference voltage generator may generate the $2^n$ upper reference voltages with respect to the n upper bits, where n is a positive integer, and the $2^n$ upper reference voltages may be uniformly spaced by a first voltage amount. The lower reference voltage generator may generate the $2^{n-1}+1$ lower reference voltages with respect to the in upper bits, where m is a positive integer, and the $2^{n-1}+1$ lower reference voltages may be uniformly spaced by a second voltage amount smaller than the first voltage amount. For example, when the number of the upper bits MSB is six, that is, n=6, the upper reference voltage generator 530 may generate the 64 ($=2^6$) upper reference voltages VREFM0 through VREFM63, as illustrated in FIG. 2, and, when the number of the lower bits LSB is four, that is, m=4, the lower reference voltage generator 560 may generate the 9 ($=2^{4-1}+1$) lower reference voltages VREFL0 through VREF8, as illustrated in FIG. 3.

Figure 12:
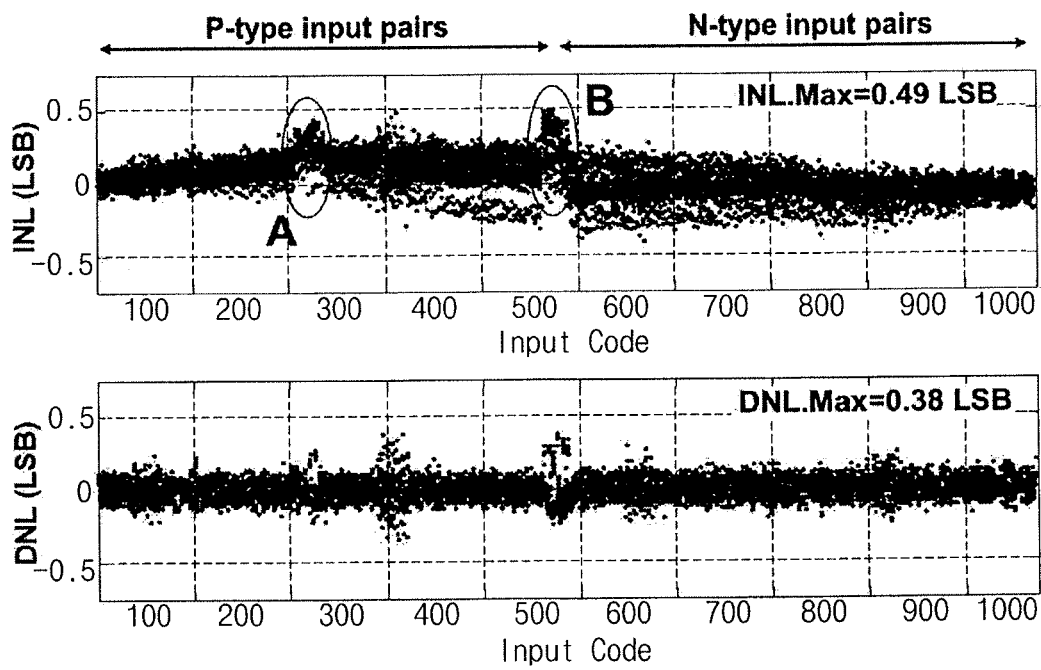
FIGS. 12 and 13 illustrate diagrams of operational characteristics of a source driver according to example embodiments.
Figure 13:
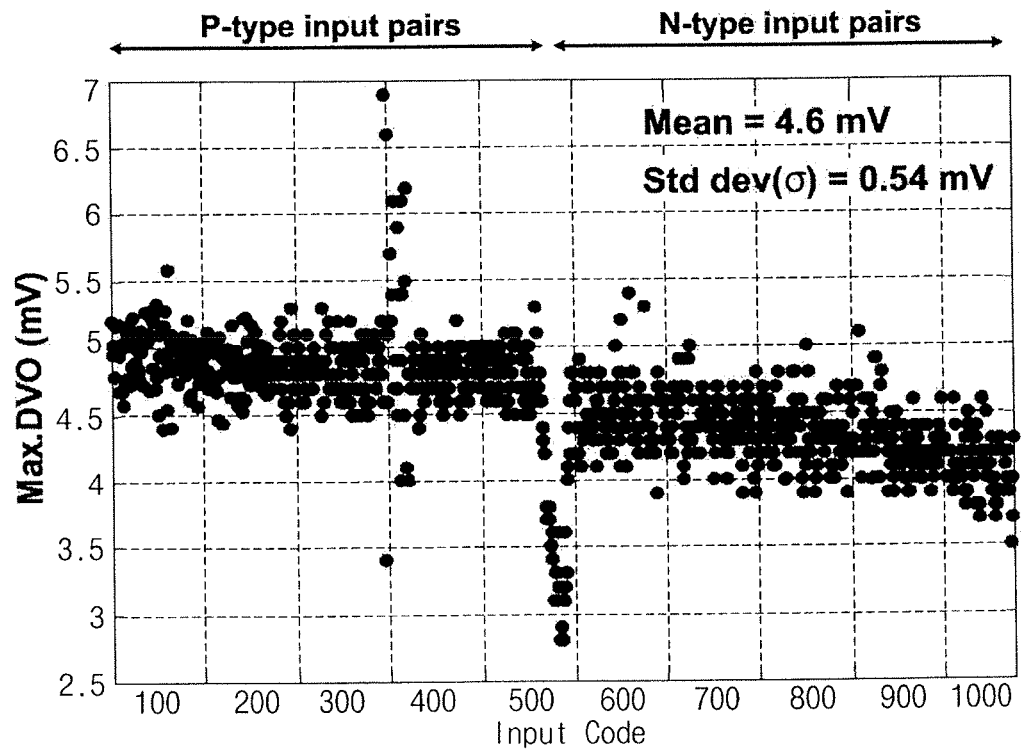

FIGS. 12 and 13 illustrate diagrams of operational characteristics of a source driver according to example embodiments.

In general, methods of testing a voltage converter may include a static testing method and a dynamic testing method. The static testing method may include calculating static parameters such as an offset, a gain, an integral non-linearity (INL), a differential non-linearity (DNL), etc., of the voltage converter, and the dynamic testing method may include calculating dynamic parameters such as a signal-to-noise ratio (SNR), a signal-to-noise and distortion (SINAD), an effective number of bits (ENOB), etc., of the voltage converter.

FIG. 12 illustrates INL and DNL of a digital-to-analog converter according to example embodiments, with respect to input codes from 0 through 1023 of input digital data DI of 10 bits. Results of eight channels are illustrated together in FIG. 12.

Referring to FIG. 12, the maximum values of INL and DNL are about 0.49 LSB and about 0.38 LSB, respectively, which represent enhanced results as compared with known converters. A region 'A' in FIG. 12 indicates distortion due to mismatch in manufacturing the resistor string of the reference voltage generator and a region 'B' in FIG. 12 indicates distortion due to the switching of the P-type differential amplifier 351 and the N-type differential amplifier 352 as illustrated in FIG. 7. Even though such distortions in the regions A and B are measured, the continuity of INL and the reduction of DNL may be significantly improved compared with known voltage converters. In addition, considering that the results of FIG. 12 are obtained when the tested input codes are varied at the relatively rapid speed of about 100 kHz, further improved performance may be expected with respect to lower speed in a real application.

FIG. 13 illustrates DVO of a digital-to-analog converter according to example embodiments, with respect to the input codes from 0 through 1023 of the input digital data DI of 10 bits. Results of 24 channels are illustrated together in FIG. 13.

The maximum DVO is about 7 mV, the mean value of DVO is about 4.6 mV, and the standard deviation is about 0.54 my, which represent enhanced results as compared with known converters.

Figure 14:
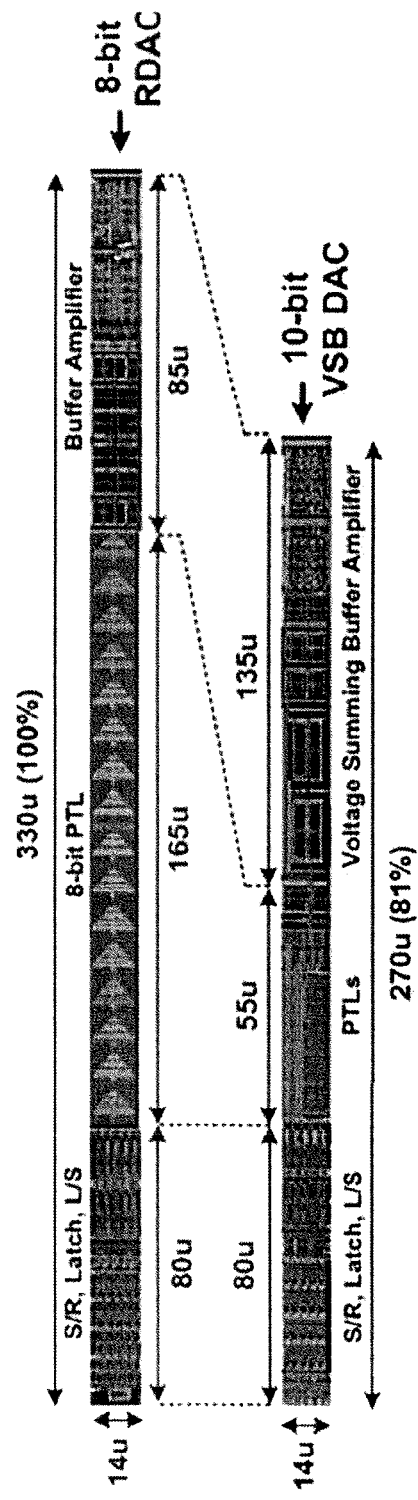
FIG. 14 illustrates a diagram for describing a size of a source driver according to example embodiments.

FIG. 14 illustrates a diagram for describing a size of a source driver according to example embodiments.

FIG. 14 illustrates a size comparison of a general 8-bit resistor-string digital-to-analog converter (8-bit RDAC in FIG. 14) and a 10-bit voltage summing buffer digital-to-analog converter (10-bit VSB DAC in FIG. 14) according to example embodiments, according to an 80 nm manufacturing process. The pitch is about 14 μm in both cases, but the height is 270 μm in the case of the VSB DAC, which is reduced compared with 330 μm in case of the RDAC. The height of the latch circuit is the same in both cases, the height of the VSB is increased a little compared with the general buffer amplifier, but the height of the pass transistor logic (PTL) is significantly reduced to 55 μm compared with 165 μm of the general PTL. As a result, the entire area of the VSB DAC according to example embodiments may be reduced by 19% compared with the general RDAC.

Figure 15:
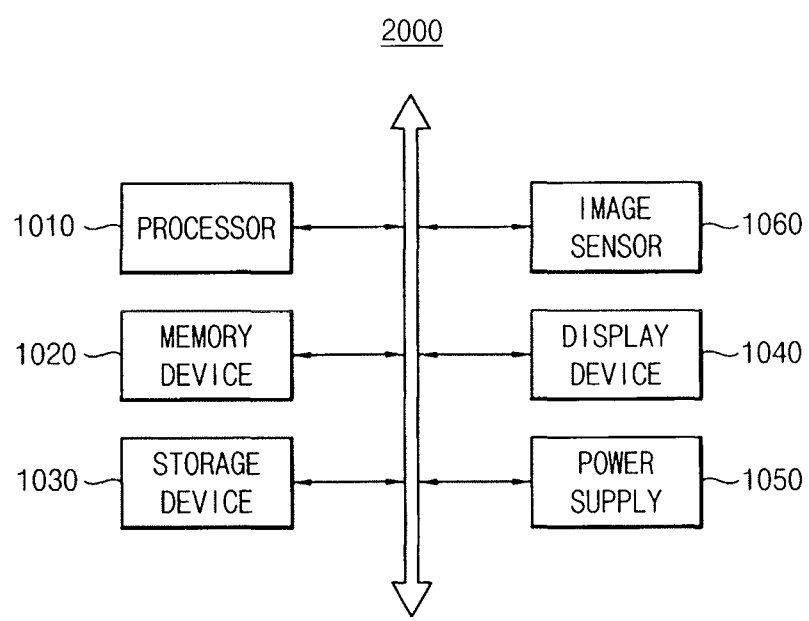
FIG. 15 illustrates a block diagram of a computing system including a display device according to example embodiments.

FIG. 15 illustrates a block diagram of a computing system including a display device according to example embodiments.

Referring to FIG. 15, a computing system 2000 may include a processor 1010, a memory device 1020, a storage device 1030, a display device 1040, a power supply 1050 and an image sensor 1060. Although not illustrated in FIG. 15, the computing system 2000 may further include ports that communicate with a video card, a sound card, a memory card, a USB device, other electronic devices, etc.

The display device 1040 may include the source driver according to example embodiments as described with reference to FIGS. 10 and 11. The processor 1010 may perform various calculations or tasks. According to embodiments, the processor 1010 may be a microprocessor or a CPU. The processor 1010 may communicate with the memory device 1020, the storage device 1030, and the display device 1040 via an address bus, a control bus, and/or a data bus. In some embodiments, the processor 1010 may be coupled to an extended bus, such as a peripheral component interconnection (PCI) bus. The memory device 1020 may store data for operating the computing system 2000. For example, the memory device 1020 may be implemented with a dynamic random access memory (DRAM) device, a mobile DRAM device, a static random access memory (SRAM) device, a phase-change random access memory (PRAM) device, a ferroelectric random access memory (FRAM) device, a resistive random access memory (RRAM) device, and/or a magnetic random access memory (MRAM) device. The storage device 1030 may include a solid state drive (SSD), a hard disk drive (HDD), a CD-ROM, etc. The computing system 2000 may further include an input device such as a touchscreen, a keyboard, a keypad, a mouse, etc., and an output device such as a printer, a display device, etc. The power supply 1050 supplies operation voltages for the computing system 2000.

The image sensor 1060 may communicate with the processor 1010 via the buses or other communication links. The image sensor 1060 may be integrated with the processor 1010 in one chip, or the image sensor 1060 and the processor 1010 may be implemented as separate chips.

At least a portion of the computing system 2000 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP). The computing system 2000 may be a computing system using a display device, e.g., a digital camera, a mobile phone, a smart phone, a portable multimedia player (PMP), a personal digital assistant (PDA), a computer, etc.

FIG. 16 illustrates a block diagram of an interface employable in the computing system of FIG. 15.

Referring to FIG. 16, a computing system 1100 may be implemented by a data processing device that uses or supports a mobile industry processor interface (MIPI) interface. The computing system 1100 may include an application processor 1110, an image sensor 1140, a display device 1150, etc. The display device 1150 may include the source driver according to example embodiments as described with reference to FIGS. 10 and 11. A CSI host 1112 of the application processor 1110 may perform a serial communication with a CSI device 1141 of the image sensor 1140 via a camera serial interface (CSI). In some embodiments, the CSI host 1112 may include a deserializer (DES), and the CSI device 1141 may include a serializer (SER). A DSI host 1111 of the application processor 1110 may perform a serial communication with a DSI device 1151 of the display device 1150 via a display serial interface (DSI).

In some embodiments, the DSI host 1111 may include a serializer (SER), and the DSI device 1151 may include a deserializer (DES). The computing system 1100 may further include a radio frequency (RF) chip 1160 performing a communication with the application processor 1110. A physical layer (PHY) 1113 of the computing system 1100 and a physical layer (PHY) 1161 of the RF chip 1160 may perform data communications based on a MIPI DigRF. The application processor 1110 may further include a DigRF MASTER 1114 that controls the data communications of the PHY 1161, and the RF chip 1160 may further include a DigRF SLAVE 1162.

The computing system 1100 may further include a global positioning system (GPS) 1120, a storage 1170, a MIC 1180, a DRAM device 1185, and a speaker 1190. In addition, the computing system 1100 may perform communications using an ultra wideband (UWB) 1210, a wireless local area network (WLAN) 1220, a worldwide interoperability for microwave access (WIMAX) 1230, etc. Other structures and interfaces of the electric device 1000 may also be used.

Features and/or embodiments described herein may be applied to a suitable device or system adopting the voltage summing buffer or the digital-to-analog converter. For example, one or more embodiments may be applied to a computing system, such as a desktop computer, a laptop computer, a digital camera, a three-dimensional camera, a facial recognition security system, a video camcorder, a cellular phone, a smart phone, a personal digital assistant (PDA), a scanner, a video phone, a digital television, a navigation system, an observation system, an auto-focus system, a tracking system, a motion capture system, an image-stabilizing system, etc.

By way of summation and review, a general linear digital-to-analog converter (DAC) may be implemented for higher resolution, but a general resistor string DAC (R-DAC) architecture may occupy too large an area because the size of pass transistor logic (PTL) may be doubled by each 1-bit increment in resolution.

As described above, example embodiments may provide a voltage summing buffer capable of exactly summing two or more voltages. Some example embodiments may provide a digital-to-analog converter and a source driver of a display device having a reduced area while providing an enhanced linear characteristic. Example embodiments may provide a voltage summing buffer having an enhanced linear characteristic with a reduced number of reference voltage lines, and a digital-to-analog converter using the voltage summing buffer.

As described above, a compact linear DAC may be used instead of a general R-DAC. In the compact linear DAC, one large PTL (e.g., as in the general R-DAC) may be replaced with smaller two sub-PTLs (see, e.g., features 130 and 160 in FIGS. 2 and 3) by applying voltage-summing buffer (VSB) that accurately sums coarse and fine two voltages. For example, a voltage summing buffer may sum a single-ended voltage VM (or upper voltage) and a differential voltage (or lower voltage), as illustrated in FIGS. 1-3 and 5-7.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A digital-to-analog converter, comprising:
    a first decoder configured to receive upper bits of a digital signal and upper reference voltages to output an upper voltage corresponding to the upper bits;
    a second decoder configured to receive lower bits of the digital signal and lower reference voltages to output a lower differential voltage corresponding to the lower bits; and
    a voltage summing buffer configured to generate an output voltage based on the upper voltage and the lower differential voltage, the output voltage corresponding to the digital signal including the upper bits and the lower bits.

2. The digital-to-analog converter as claimed in claim 1, wherein the first decoder selects one of the upper reference voltages in response to the upper bits to output the selected upper reference voltage as the upper voltage, and the second decoder selects a positive voltage and a negative voltage among the lower reference voltages in response to the lower bits to output the positive voltage and the negative voltage as the lower differential voltage.

3. The digital-to-analog converter as claimed in claim 2, wherein the first decoder selects a lowest voltage from among the upper reference voltages when the upper bits are all zero, and the second decoder selects a maximum voltage from among the lower reference voltages when a most significant bit of the lower bits is zero.

4. The digital-to-analog converter as claimed in claim 2, further comprising:
    an upper reference voltage generator configured to generate $2^n$ upper reference voltages with respect to n upper bits, n being a positive integer, the $2^n$ upper reference voltages being uniformly spaced by a first voltage amount; and
    a lower reference voltage generator configured to generate $2^{n-1}+1$ lower reference voltages with respect to m lower bits, m being a positive integer, the $2^{n-1}+1$ lower reference voltages being uniformly spaced by a second voltage amount smaller than the first voltage amount.

5. The digital-to-analog converter as claimed in claim 4, wherein the lower differential voltage is sequentially increased by Vgl from -Vgm/2 to Vgm/2 as a value of the lower bits is increased by one, Vgm being the first voltage amount and Vgl being the second voltage amount.

6. The digital-to-analog converter as claimed in claim 4, wherein the second decoder includes:
    a multiplexer configured to select a maximum voltage or a minimum voltage among the lower reference voltages in response to a most significant bit of the lower bits to output the selected voltage as the negative voltage of the lower differential voltage; and
    a pass transistor logic configured to select one of the lower reference voltages in response to remaining bits of the lower bits, the remaining bits being the lower bits except the most significant bit of the lower bits, to output the selected voltage as the positive voltage of the lower differential voltage.

7. The digital-to-analog converter as claimed in claim 1, wherein the voltage summing buffer includes:
    a first differential amplifier configured to receive the output voltage as feedback and receive the upper voltage, the fedback output voltage and the upper voltage being received as a first differential input, to generate a first differential current to a summing node pair;
    a second differential amplifier configured to receive the positive voltage and the negative voltage of the lower differential voltage as a second differential input to generate a second differential current to the summing node pair; and
    an output buffer configured to generate the output voltage based on a voltage or a current of at least one node of the summing node pair.

8. The digital-to-analog converter as claimed in claim 7, wherein a transconductance of the first differential amplifier is substantially equal to a transconductance of the second differential amplifier.

9. The digital-to-analog converter as claimed in claim 7, wherein the voltage summing buffer further includes a third differential amplifier configured to receive first and second voltages of a second differential input voltage as a third differential input to generate a third differential current to the summing node pair.

10. The digital-to-analog converter as claimed in claim 1, wherein the voltage summing buffer includes:
    a P-type differential amplifier coupled between a first power supply voltage and a first summing node pair, the P-type differential amplifier being configured to receive the output voltage as feedback and receive the upper voltage, the fedback output voltage and the upper voltage being received as a first differential input, to generate a first differential current to the first summing node pair, the P-type differential amplifier being configured to receive the positive voltage and the negative voltage of the lower differential voltage as a second differential input to generate a second differential current to the first summing node pair;
    an N-type differential amplifier coupled between a second power supply voltage and a second summing node pair, the N-type differential amplifier being configured to receive the output voltage as feedback and receive the upper voltage, the fedback output voltage and the upper voltage being received as a third differential input, to generate a third differential current to the second summing node pair, the N-type differential amplifier being configured to receive the lower differential voltage as a fourth differential input to generate a fourth differential current to the second summing node pair; and an output buffer configured to generate the output voltage based on a sourcing differential current at the first summing node pair and a sinking differential current at the second summing node.

11. The digital-to-analog converter as claimed in claim 10, wherein the P-type differential amplifier is enabled in response to a switch signal and the N-type differential amplifier is enabled in response to an inversion signal of the switch signal, the switch signal being activated when a value of the upper bits is smaller than a center value of the upper bits.

12. A voltage summing buffer, comprising:
a first differential amplifier configured to receive an output voltage and a single-ended input voltage as a first differential input to generate a first differential current to a summing node pair;
a second differential amplifier configured to receive first and second voltages of a first differential input voltage as a second differential input to generate a second differential current to the summing node pair; and
an output buffer configured to generate the output voltage based on a voltage or a current at one of the summing node pair.

13. The voltage summing buffer as claimed in claim 12, wherein the first differential input voltage has a level for compensating an offset of the single-ended input voltage.

14. The voltage summing buffer as claimed in claim 12, further comprising:
a third differential amplifier configured to receive first and second voltages of a second differential input voltage as a third differential input to generate a third differential current to the summing node pair.

15. A source driver of a display device, the source driver comprising:
a reference voltage generator configured to generate upper reference voltages and lower reference voltages; and
a plurality of digital-to analog converters configured to convert a plurality of digital signals to a plurality of output voltages, respectively, wherein each digital-to analog converter includes:
a first decoder configured to receive upper bits of each digital signal and the upper reference voltages to output an upper voltage corresponding to the upper bits;
a second decoder configured to receive lower bits of each digital signal and the lower reference voltages to output a lower differential voltage corresponding to the lower bits; and
a voltage summing buffer configured to generate each output voltage of the plurality of output voltages based on the upper voltage and the lower differential voltage, each output voltage of the plurality of output voltages corresponding to one of the digital signals of the plurality of digital signals including the upper bits and the lower bits.

16. The source driver as claimed in claim 15, wherein the reference voltage generator includes:
an upper reference voltage generator configured to generate $2^n$ upper reference voltages with respect to n upper bits, n being a positive integer, the $2^n$ upper reference voltages being uniformly spaced by a first voltage amount; and
a lower reference voltage generator configured to generate $2^{n-1}+1$ lower reference voltages with respect to m lower bits, m being a positive integer, the $2^{n-1}+1$ lower reference voltages being uniformly spaced by a second voltage amount smaller than the first voltage amount.

17. The source driver as claimed in claim 15, further comprising:
a gamma correction circuit configured to receive a serial data signal and perform a gamma correction on the serial data signal to output a corrected serial data signal; and
a latch circuit configured to latch the corrected serial data signal sequentially and deserialize the latched values to generate the plurality of digital signals provided to the digital-to analog converters.

18. A display device comprising the source driver as claimed in claim 15.

19. The display device as claimed in claim 18, further comprising a gate driver, wherein the gate driver is configured to drive row lines of a display panel, and the source driver is configured to drive column lines of the display panel.

20. The display device as claimed in claim 19, wherein:
the display panel includes a plurality of pixels, the pixels being arranged in a matrix, each pixel including at least one transistor having a gate coupled to a row line and having an electrode coupled to a column line, and
a serial data signal is provided to the source driver, the serial data signal being converted by the source driver, the source driver outputting analog output voltages to the column lines so as to display images corresponding to the serial data signal.

* * * * *